United States Patent
Wang et al.

(10) Patent No.: US 10,267,545 B2
(45) Date of Patent: Apr. 23, 2019

(54) IN-PLANE ACTIVE COOLING DEVICE FOR MOBILE ELECTRONICS

(71) Applicant: QUALCOMM Incorporated, San Diego, CA (US)

(72) Inventors: Peng Wang, San Diego, CA (US); Unnikrishnan Vadakkanmaruveedu, Chandler, AZ (US); Vinay Mitter, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 370 days.

(21) Appl. No.: 15/086,039

(22) Filed: Mar. 30, 2016

(65) Prior Publication Data

US 2017/0284708 A1    Oct. 5, 2017

(51) Int. Cl.
| | | |
|---|---|---|
| G06F 1/20 | (2006.01) | |
| F25B 21/04 | (2006.01) | |
| H01L 23/38 | (2006.01) | |
| H01L 35/30 | (2006.01) | |
| H01L 35/32 | (2006.01) | |

(52) U.S. Cl.
CPC ............... *F25B 21/04* (2013.01); *G06F 1/20* (2013.01); *G06F 1/203* (2013.01); *H01L 23/38* (2013.01); *H01L 35/30* (2013.01); *H01L 35/32* (2013.01)

(58) Field of Classification Search
CPC .......... F25B 21/04; G06F 1/20; G06F 1/2023; H01L 35/30; H01L 35/32
See application file for complete search history.

(56) References Cited

U.S. PATENT DOCUMENTS

| | | | |
|---|---|---|---|
| 6,282,907 B1 | 9/2001 | Ghoshal | |
| 6,791,150 B2 | 9/2004 | Takagi | |
| 7,310,123 B2* | 12/2007 | Lee | ........................ G02F 1/133 |
| | | | 349/61 |
| 2003/0127661 A1* | 7/2003 | Takagi | ................ H01S 5/02415 |
| | | | 257/98 |
| 2006/0076046 A1 | 4/2006 | Ghoshal et al. | |
| 2008/0155992 A1 | 7/2008 | Hodes et al. | |
| 2009/0071525 A1 | 3/2009 | Hodes et al. | |
| 2015/0034140 A1 | 2/2015 | Span et al. | |
| 2017/0062689 A1* | 3/2017 | Kang | ...................... H01L 35/30 |

OTHER PUBLICATIONS

International Search Report and Written Opinion—PCT/US2017/024517—ISA/EPO—dated Jun. 8, 2017.

* cited by examiner

*Primary Examiner* — Elizabeth J Martin

(74) *Attorney, Agent, or Firm* — Muncy, Geissler, Olds & Lowe, P.C./QUALCOMM

(57) ABSTRACT

An active heat transfer device is proposed for heat management in apparatuses such as mobile devices. The proposed heat transfer device may include a thermoelectric (TE) layer, and first and second electrodes both on lateral surfaces of the TE layer. When there is a voltage differential between the first and second electrodes, heat from a heat source may be transferred laterally within the TE layer from the first electrode to the second electrode.

30 Claims, 11 Drawing Sheets

IN-PLANE ACTIVE COOLING DEVICE FOR MOBILE ELECTRONICS

FIELD OF DISCLOSURE

Various aspects described herein relate to thermal management in electronics, and more particularly, to in-plane active cooling devices.

BACKGROUND

Thermal management can be critical for systems such as mobile devices. This is because the system performance can be thermally limited by a maximum allowable junction temperature in most use cases. Skin temperature can be another important design constraint because high surface temperature can make the device uncomfortable to use or can result in local skin burns. For example, original equipment manufacturers (OEMs) typically require 45° C. as the maximum allowable temperature for plastic surfaces and 40° C. for metallic surfaces. Thus, the system performance can sometimes be thermally limited by the skin temperatures.

Therefore, in systems such as mobile electronic devices, it would be desirable to address one or both of comfortable surface touch temperature and maximum temperature limitations of critical internal components such as central processing unit (CPU), graphics processing unit (GPU), power management integrated circuit (PMIC), and so on. Conventionally, cooling solutions for mobile devices are software-based thermal mitigation and thermal/mechanical-based passive heat spreading.

SUMMARY

This summary identifies features of some example aspects, and is not an exclusive or exhaustive description of the disclosed subject matter. Whether features or aspects are included in, or omitted from this Summary is not intended as indicative of relative importance of such features. Additional features and aspects are described, and will become apparent to persons skilled in the art upon reading the following detailed description and viewing the drawings that form a part thereof.

One or more aspects are directed to a heat transfer device configured to actively transfer heat. The heat transfer device may comprise a thermoelectric (TE) layer, a first electrode, and a second electrode. The TE layer may have a first lateral surface, a second lateral surface, a first side surface, and a second side surface. The first and second lateral surfaces may be longer than the first and second side surfaces. The first electrode may be on the first lateral surface of the TE layer and may interface with the TE layer at a first junction. The second electrode may be on the on the first lateral surface or on the second lateral surface of the TE layer and may interface with the TE layer at a second junction. The heat transfer device may be configured to transfer heat generated by a heat source laterally within the TE layer from the first electrode to the second electrode when there is a voltage differential between the first electrode and the second electrode.

One or more aspects are directed to an apparatus that may comprise a chip, a battery configured to provide power to the chip, and a heat transfer device configured to actively transfer heat away from the chip. The heat transfer device may comprise a thermoelectric (TE) layer, a first electrode, and a second electrode. The TE layer may have a first lateral surface, a second lateral surface, a first side surface, and a second side surface. The first and second lateral surfaces may be longer than the first and second side surfaces. The first electrode may be on the first lateral surface of the TE layer and may interface with the TE layer at a first junction, which may overlap the chip. The second electrode may be on the on the first lateral surface or on the second lateral surface of the TE layer and may interface with the TE layer at a second junction. The heat transfer device may be configured to transfer the heat generated by the chip laterally within the TE layer from the first electrode to the second electrode when the battery causes a voltage differential between the first electrode and the second electrode.

One or more aspects are directed to a method of forming a heat transfer device to actively transfer heat. The method may comprise forming a thermoelectric (TE) layer, forming a first electrode, and forming a second electrode. The TE layer may be formed with a first lateral surface, a second lateral surface, a first side surface, and a second side surface such that each of the first and second lateral surfaces is longer than each of the first and second side surfaces. The first electrode may be formed on the first lateral surface of the TE layer such that the first electrode interfaces with the TE layer at a first junction. The second electrode may be formed on the first lateral surface or on the second lateral surface of the TE layer such that the second electrode interfaces with the TE layer at a second junction. The heat transfer device may be formed such that heat generated by a heat source is transferred laterally within the TE layer from the first electrode to the second electrode when there is a voltage differential between the first electrode and the second electrode.

One or more aspects are directed to a heat transfer device configured to actively transfer heat. The heat transfer device may comprise a thermoelectric (TE) layer, means for applying a first voltage, and means for applying a second voltage. The TE layer may have a first lateral surface, a second lateral surface, a first side surface, and a second side surface. The first and second lateral surfaces may be longer than the first and second side surfaces. The means for applying the first voltage, e.g., a first electrode, may be on the first lateral surface of the TE layer and may interface with the TE layer at a first junction. The means for applying the second voltage, e.g., a second electrode, may be on the on the first lateral surface or on the second lateral surface of the TE layer and may interface with the TE layer at a second junction. The heat transfer device may be configured to transfer heat laterally within the TE layer from the means for applying the first voltage to the means for applying the second voltage when there is a voltage differential between the means for applying the first voltage and the means for applying the second voltage.

BRIEF DESCRIPTION OF THE DRAWINGS

The accompanying drawings are presented to aid in the description of examples and are provided solely for illustration of the examples and not limitation thereof.

DETAILED DESCRIPTION

Aspects are provided in the following description and related drawings directed to specific examples of one or more aspects of the present disclosure. Alternate examples may be devised without departing from the scope of the discussion. Additionally, well-known elements will not be described in detail or will be omitted so as not to obscure the relevant details.

The word "exemplary" is used herein to mean "serving as an example, instance, or illustration." Any example described herein as "exemplary" is not necessarily to be construed as preferred or advantageous over other examples. Likewise, the term "embodiments" does not require that all embodiments of the disclosed subject matter include the discussed feature, advantage, or mode of operation.

The terminology used herein is for the purpose of describing particular example only and is not intended to be limiting. As used herein, the singular forms "a", "an", and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof.

Further, many examples are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer-readable storage medium having stored therein a corresponding set of computer instructions that upon execution would cause an associated processor to perform the functionality described herein. Thus, the various aspects may be embodied in a number of different forms, all of which have been contemplated to be within the scope of the claimed subject matter. In addition, for each of the examples described herein, the corresponding form of any such examples may be described herein as, for example, "logic configured to" perform the described action.

As mentioned, conventional thermal management for mobile devices include software-based thermal mitigation and thermal/mechanical-based passive heat spreading. Instead of or in addition thereto, it is proposed to provide thermal management utilizing a heat transfer device that actively transfers heat. The proposed heat transfer device may be used on its own, or in combination with the software-based thermal mitigation and/or the passive thermal/mechanical-based passive heat spreading.

Figure 1:
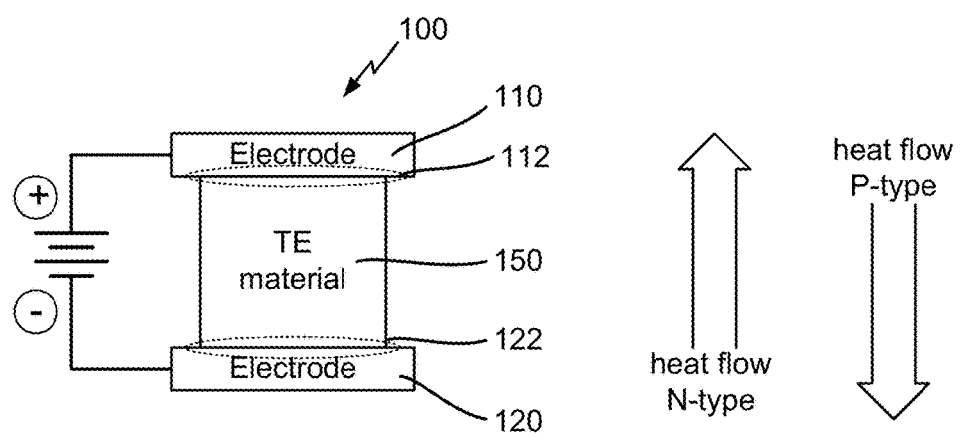
FIGS. 1 and 2 illustrate a conventional thermoelectric cooler for explanation of thermoelectricity and operation.

A thermoelectric cooler (TEC) is an example of an active heat transfer device. A TEC is a solid state pump that utilizes the phenomenon of electrical-thermal energy conversion to pump heat from one side to the other to achieve active cooling. The principle of TEC operation is illustrated in FIG. 1. As illustrated, a TEC 100 may include thermoelectric (TE) material 150 in between first and second electrodes 110, 120, respectively. The TE material 150 can be an N-type or a P-type semiconductor and the first and second electrodes 110, 120 can be metallic.

Physics of thermoelectricity is briefly explained. When two different materials (e.g., metal and semiconductor) are joined together and an electric current flows through the junction of the two materials, heat is absorbed or released at the junction between the different materials depending on the current flow direction and the semiconductor type. At the junction where heat is absorbed, cooling takes place. Conversely, at the junction where heat is released, heating takes place. In FIG. 1, there are two junctions highlighted by dashed ovals—a first junction 112 between the first electrode 110 and the TE material 150, and a second junction 122 between the TE material 150 and the second electrode 120.

When power is applied to the first and second electrodes 110, 120, heat is absorbed at one junction and is released at the other junction. Hence, heat flows from one electrode to the other. If a voltage differential is such that the voltage applied to the first electrode 110 is higher than the voltage applied to the second electrode 120, then the current flows from the first electrode 110 to the second electrode 120 within the TE material 150 (assuming that current flow is viewed as being opposite to the flow of electrons). If the TE material 150 is a P-type semiconductor, heat is pumped to flow in the direction of the current from the positive voltage side to the negative voltage side. In other words, heat is absorbed at the first junction 112 and released at the second junction 122. If the TE material 150 is an N-type semiconductor, heat is pumped in the direction opposite of the current—from the negative voltage side (heat absorbed at the second junction 122) to the positive voltage side (released at the first junction 112).

Figure 2:
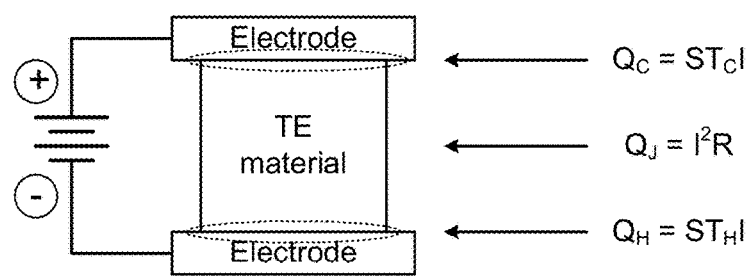

The thermoelectric cooling and heating power Q is proportional to the absolute temperature T, applied current I, and the Seebeck coefficient S, and can be given by Q=STI. Then the cooling power $Q_C$ that occurs at the heat absorption junction can be expressed as $Q_C=ST_CI$. Similarly, the heating power $Q_H$ that occurs at the heat release junction can be expressed as $Q_H=ST_HI$. However, additional heat is also generated due to the current flowing through the TE material 150. Such Joule heating $Q_J$ can be quantified as $Q_J=I^2R$ where R is the resistance of the current path. Assuming that the first and second electrodes 110, 120 are metals, much of the resistance will be due to the TE material 150. These three heat powers—$Q_C$, $Q_H$ and $Q_J$—are illustrated in FIG. 2 assuming that the TE material 150 is a P-type semiconductor.

Thermoelectric cooling efficiency can be characterized by the coefficient of performance (COP), which can be defined as a ratio of the heat pumped to the power input. In one perspective, the heat pumped may be equated with the cooling power $Q_C$. The COP normally depends on a temperature difference between cold and hot sides. This means that the COP is inversely related to the temperature difference, e.g., COP decreases as the temperature difference increases.

As indicated above, it is proposed to provide thermal management utilizing an active heat transfer device such as the TECs. However, a conventional cross-plane TEC is unsuitable in a mobile device due to the mobile device's small form factor making it difficult to accommodate the millimeter-scaled TEC, and does not provide sufficient capability to remove the thermoelectric heat STI and the Joule heat $I^2R$. Another limitation of the conventional TEC is when it is integrated into a mobile device, it either makes the junction cooler but the skin hotter, or makes the skin colder but the junction hotter.

To address one or more disadvantages of conventional thermal management solutions, it is proposed to integrate an in-plane active cooling device that can transport heat laterally from hot areas to cold areas of mobile devices. One or more aspects of the proposal can achieve effective thermal management by reducing both junction temperatures and skin hot spot temperatures.

Figure 3A:
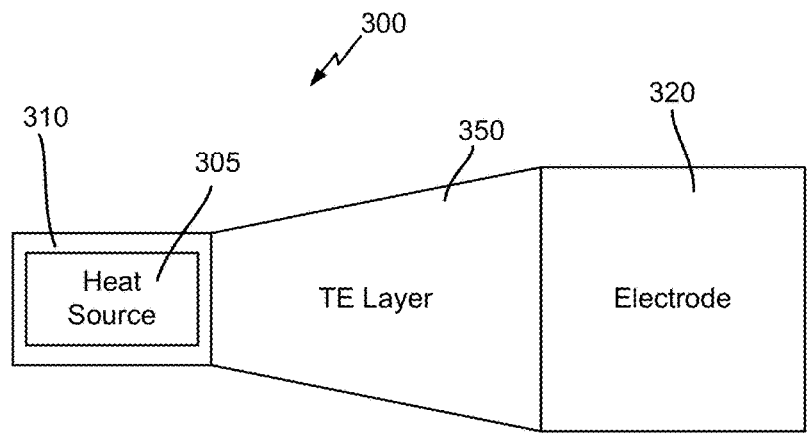
FIGS. 3A and 3B illustrate top and side views of a thermoelectric cooler according to a non-limiting aspect of the disclosure.
Figure 3B:
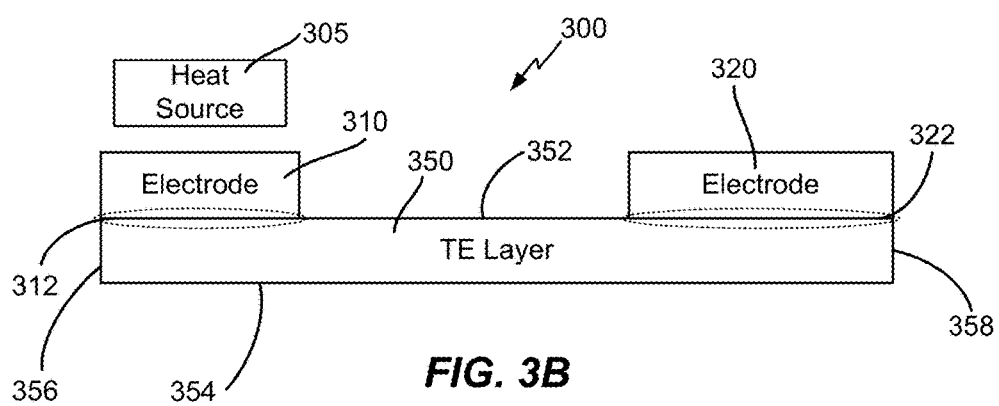

A non-limiting example of a heat transfer device 300—e.g., a thermoelectric cooler (TEC)—is illustrated in FIGS. 3A and 3B. The heat transfer device 300 is an active heat transfer device. FIG. 3A illustrates a top view and FIG. 3B illustrates a side view. The heat transfer device 300 may have an in-plane configuration which allows heat to be pumped laterally. As seen, the heat transfer device 300 may include a thermoelectric (TE) layer 350, a first electrode 310 and a second electrode 320. The first electrode 310 may be an example of means for applying a first voltage, and the second electrode 320 may be an example of means for applying a second voltage. The TE layer 350 may be an N-type or a P-type semiconductor, and may have first and second lateral surfaces 352, 354 and first and second side surfaces 356, 358 (see FIG. 3B). From a perspective, the first and second lateral surfaces 352, 354 are referred to as lateral surfaces in that they are longer than the first and second side surfaces 356, 358. For convenience, the first and second lateral surfaces 352, 354 and the first and second side surfaces 356, 358 may also be referred to as upper, lower, left and right surfaces 352, 354, 356, 358. It should be noted that the adjectives upper, lower, left and right are for convenience only, and should not be taken to indicate absolute orientations.

The first electrode 310 may be on one of the lateral surfaces—the upper surface 352 or on the lower surface 354—of the TE layer 350. Where the first electrode 310 and the TE layer 350 interface with each other may be referred to as a first junction 312. In this instance, "interface" may be synonymous with "in contact". For ease of discussion, it will be assumed that the first electrode 310 is on the first lateral surface 352 of the TE layer 350. From a perspective, it may be said that the first junction 312 is a part of the first lateral surface 352.

In an aspect, the first electrode 310 is highly conductive both electrically and thermally. For example, the first electrode 310 may be a metal. The first electrode 310 may be located at, or substantially at, one end of the TE layer 350. In FIG. 3B, the first electrode 310 is illustrated as being even, or substantially even, with the left surface 356 of the TE layer 350 and extending toward the right surface 358. Since the first electrode 310 interfaces with the TE layer 350 at the first junction 312, it may be said that the first junction 312 can begin at or substantially at the first side surface 356 and extend towards the second side surface 358.

The second electrode 320 may also be on the upper surface 352 of the TE layer 350 such that the second electrode 320 and the TE layer 350 interface with each other at a second junction 322. That is, the second junction 322 may also be a part of the first lateral surface 352. The second electrode 320, like the first electrode 310, may be highly conductive both electrically and thermally such as metal. The second electrode 320 may be formed from the same or different material used to form the first electrode 310. The second electrode 320 may be located at, or substantially at, an end of the TE layer 350 opposite the end where the first electrode 310 is located. In FIG. 3B, the second electrode 320 is illustrated as being even, or substantially even, with the right surface 358 of the TE layer 350 and extending toward the left surface 356. Since the second electrode 320 interfaces with the TE layer 350 at the second junction 322, it may be said that the second junction 322 can begin at or substantially at the second side surface 358 and extend towards the first side surface 356.

In FIGS. 3A and 3B, it may be assumed that when there is a voltage differential between the first electrode 310 and the second electrode 320, heat flows laterally within the TE layer 350 from the first electrode 310 to the second electrode 320 (left to right in these figures). That is, when power is applied between the first and second electrodes 310, 320, heat may be absorbed at the first junction 312 and released at the second junction 322. If the TE layer 350 is a P-type semiconductor, then the voltage potential applied to the first electrode 310 should be higher. If the TE layer 350 is an N-type semiconductor, then the potential applied to the second electrode 320 should be higher.

A heat source 305 is shown in FIGS. 3A and 3B. The heat source 305 may be a chip such as a CPU, GPU, PMIC, or any device that is to be cooled. The heat source 305 itself is not necessarily a part of the heat transfer device 300. Rather, the heat source 305 is shown to indicate that the first electrode 310 is located nearby in an aspect. In this way, the heat generated by the heat source 305 may be absorbed at the first junction 312 through the first electrode 310, laterally transferred through the TE layer 350, and released at the second junction 322 through the second electrode 320. To enhance efficiency, the conduction of heat from the heat source 305 to the first electrode 310 should be maximized. One way to achieve this is to have an area of overlap, at least partially, between the heat source 305 and the first junction 312. In an aspect, the first junction 312 can completely overlap the heat source 305 as illustrated in FIG. 3A. This implies that if the complete overlap is to occur, the area of the first junction 312 should be at least as large as the area of the heat source 305.

Another way to enhance heat transfer is to increase the heat release area, which in turn would increase the heat dissipation capability of the heat transfer device 300. For example, as illustrated in FIG. 3B, the second junction 322 may have an area larger than that of the first junction 312. The second junction 322 having a larger area is not a requirement, but with such structure, the heat absorbed at the first junction 312 may be released over a larger area at the second junction 322.

Figure 4A:
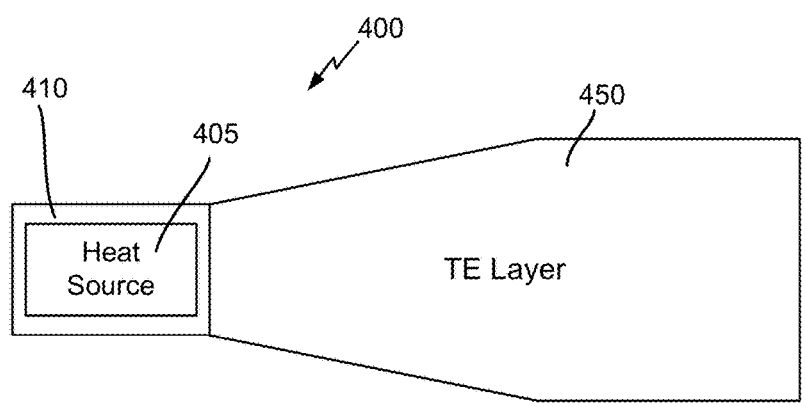
FIGS. 4A and 4B illustrate top and side views of a thermoelectric cooler according to a non-limiting aspect of the disclosure.
Figure 4B:
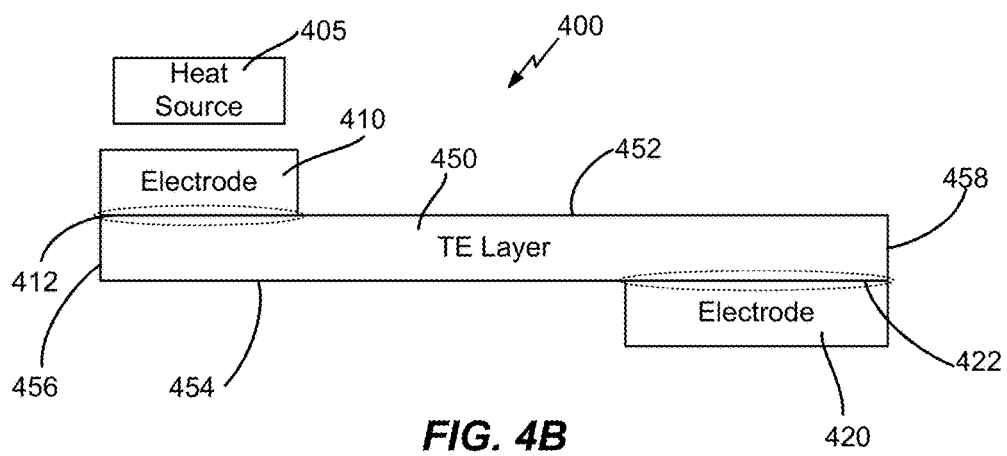

In FIG. 3B, the first and second junctions 312, 322 are both illustrated as being on the same lateral surface of the TE layer 350, the upper (first lateral) surface 352 in this instance. However, this is not a requirement as demonstrated in FIGS. 4A and 4B which illustrates a heat transfer device 400. Other than being prefaced with "4" instead of "3", the elements of the heat transfer device 400 are numbered similar to the elements of the heat transfer device 300.

The structure of the heat transfer device 400, which is also active, may be similar to that of the heat transfer device 300. For example, the heat transfer device 400 may include a thermoelectric (TE) layer 450, a first electrode 410 and a second electrode 420 (see FIG. 4B). The first electrode 410 may be another example of means for applying the first voltage, and the second electrode 420 may be another example of means for applying the second voltage. The first electrode 410, which may be formed of metal, may interface with the TE layer 450 at a first junction 412, and the second electrode 420, which may be formed of same or different metal, may interface with the TE layer 450 at a second junction 422. The first junction 412 may begin at or near a left (first side) surface 456 and extend towards a right (second side) surface 458, and the second junction 422 may begin at or near the right (second side) surface 458 and extend towards the left (first side) surface 456. When there is a voltage differential between the first and second electrodes 410, 420, it may be assumed that the heat flows laterally within the TE layer 450 from the first electrode 410 to the second electrode 420. There may be a partial or whole overlap between the first junction 412 and a heat source 405. Further, the second junction 422 may have a larger area than the first junction 412.

However, unlike the heat transfer device 300, the first and second electrodes 410, 420 of the heat transfer device 400 may be on opposite lateral surfaces. This implies that the first and second junctions 412, 422 may also be parts of opposite lateral surfaces. In this instance, the first and second electrodes 410, 420 are respectively illustrated as being on upper and lower surfaces 452, 454. That is, the first junction 412 may be a part of the upper (first lateral) surface 452 and the second junction 422 may be a part of the lower (second lateral) surface 454. While not shown, it is of course possible to have structure in which the first and second electrodes 410, 420 are respectively on the lower and upper surfaces 454, 452.

Figure 5A:
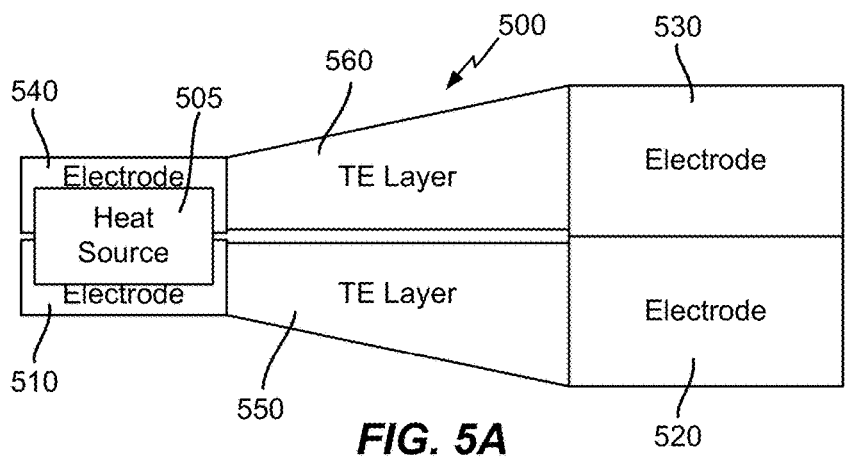
FIGS. 5A, 5B and 5C illustrate a top view, a first side view, and a second side view of a thermoelectric cooler according to a non-limiting aspect of the disclosure.
Figure 5B:
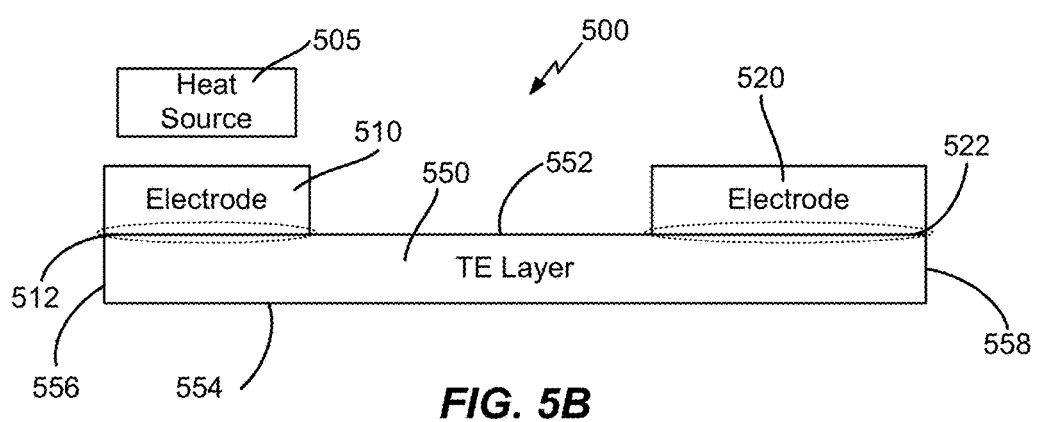
Figure 5C:
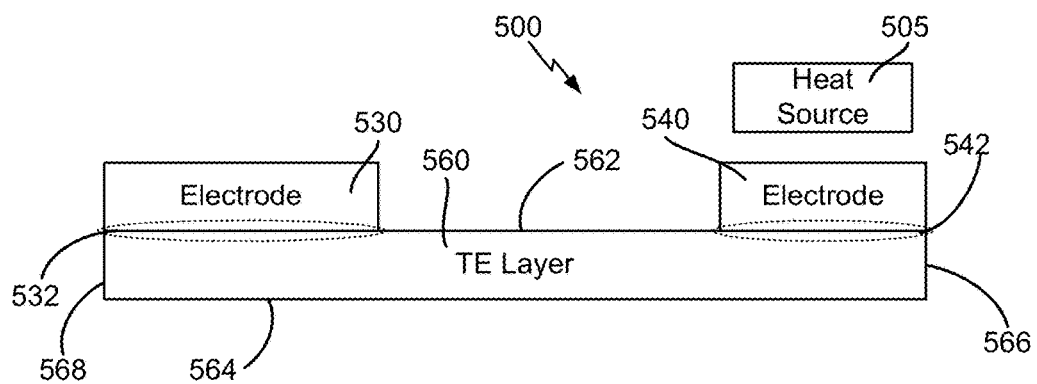

Recall from above that the TE layers 350, 450 may be a P-type semiconductor or an N-type semiconductor. It is also possible to have both P-type and N-type semiconductors in a heat transfer device as illustrated in FIGS. 5A, 5B and 5C. FIG. 5A illustrates a top view, FIG. 5B illustrates one side view, and FIG. 5C illustrates an opposite side view of the heat transfer device 500.

As illustrated, the heat transfer device 500 may include a first TE layer 550, a first electrode 510 and a second electrode 520. The first electrode 510 may be a further example of means for applying the first voltage, and the second electrode 520 may be a further example of means for applying the second voltage. From a perspective, the first TE layer 550, the first electrode 510 and the second electrode 520 may be viewed as being similar to the TE layer 350, the first electrode 310 and the second electrode 320 of the heat transfer device 300. That is, the first TE layer 550 may be an N-type or a P-type semiconductor, and may have first and second lateral surfaces 552, 554 and first and second side surfaces 556, 558 (see FIG. 5B). The first and second electrodes 510, 520 each may be on the first or second lateral surface 552, 554 of the first TE layer 550. For simplicity of description, it may be assumed that the first and second electrodes 510, 520 are both on the first lateral surface 552, which implies that both first and second junctions 512, 522 are parts of the first lateral surface 552. Both the first and second electrodes 510, 520 may be formed from metal (same or different). The first junction 512 may begin at or substantially at the first side surface 556 and extend towards the second side surface 558, and the second junction 522 may begin at or substantially at the second side surface 558 and extend towards the first side surface 556.

The heat transfer device 500 may further include a second TE layer 560, a third electrode 530 and a fourth electrode 540. The third electrode 530 may be an example of means for applying a third voltage, and the fourth electrode 540 may be an example of means for applying a fourth voltage. From a perspective, the second TE layer 560 and the third and fourth electrodes 530, 540 may be viewed as being mirror images of the first TE layer 550, the first electrode 510, and the second electrode 520 (see FIG. 5A). For example, the second TE layer 560 may be a semiconductor of an opposite type to that of the first TE layer 550. The second TE layer 560 may have third and fourth lateral surfaces 562, 564 and third and fourth side surfaces 566, 568 in which the third and fourth lateral surfaces 562, 564 are longer than the third and fourth side surfaces 566, 568 (see FIG. 5C).

Corresponding surfaces of the first and second TE layers 550, 560 may define substantially parallel planes. That is, the planes of the third and fourth lateral surfaces 562, 564 may be substantially parallel to the planes of the first and second lateral surfaces 552, 554. Similarly, the planes of the third and fourth side surfaces 566, 568 may be substantially parallel to the planes of the first and second side surfaces 556, 558. Indeed, as illustrated in FIG. 5A, the corresponding planes of the first and second TE layers 550, 560 may be substantially coplanar.

The third and fourth electrodes 530, 540 each may be on the third or fourth lateral surface 562, 564 of the second TE layer 560. Again for simplicity of description, it may be assumed that the third and fourth electrodes 530, 540 are both on the third lateral surface 562, which implies that both third and fourth junctions 532, 542 are parts of the third lateral surface 562. Both the third and fourth electrodes 530, 540 may be formed from metal (same or different).

As illustrated in FIG. 5A, the first and second TE layers 550, 560 may be located side by side. Also, the third electrode 530 may be located adjacent to the second electrode 520, and the fourth electrode 540 may be located adjacent to the first electrode 510. This means that the third junction 532 (the interface between the third electrode 530 and the second TE layer 560) may begin at or substantially at the fourth side surface 568 and extend towards the third side surface 566. Also, the fourth junction 542 (the interface between the fourth electrode 540 and the second TE layer 560) may begin at or substantially at the third side surface 566 and extend towards the fourth side surface 568 (see FIG. 5C).

The second and third electrodes 520, 530 may be coupled so as to be at a same electrical potential. In this way, a series electrical path may be formed in order from the first electrode 510, the first TE layer 550, the second electrode 520, the third electrode 530, the second TE layer 560 and the fourth electrode 540. For example, assume that a voltage is applied such that the voltage at the first electrode 510 is higher than the voltage at the fourth electrode 540. Then, a voltage drop would occur from the first electrode 510 to the second electrode 520, and another voltage drop would occur from the third electrode 530 to the fourth electrode 540. Then in FIG. 5A, the resulting current would flow in a left to right direction in the first TE layer 550 and right to left direction in the second TE layer 560. Any voltage drop between the second and third electrodes 520, 530 would be negligible when they are electrically coupled. In one aspect, a single electrode may serve as the second and third electrodes 520, 530.

When the first and second TE layers 550, 560 are located side by side as illustrated in FIG. 5A to form the series electrical path, this configuration can transfer heat in parallel directions. For example, assume that the voltage is applied to the first and fourth electrodes 510, 540 as described immediately above. Also assume that the first TE layer 550 is a P-type semiconductor and the second TE layer 560 is an N-type semiconductor. In FIG. 5A, heat would be laterally transferred from left to right in both the first TE layer 550 and in the second TE layer 560. In the first TE layer 550, heat would be transferred in the direction of the current—from the first electrode 510 to the second electrode 520—since the first TE layer 550 is P-type. In the second TE layer 560, heat would be transferred in the opposite direction of the current—from the fourth electrode 540 to the third electrode 530—since the second TE layer is N-type. In other words, a thermal path from the first electrode 510 to the second electrode 520 within the first TE layer 550 may be substantially parallel to a thermal path from the fourth electrode 540 to the third electrode 530 within the second TE layer 560.

It may be assumed that when there is a voltage differential between the first electrode 510 and the fourth electrode 540, heat flows laterally within the first TE layer 550 from the first electrode 510 to the second electrode 520, and also flows laterally within the second TE layer 560 from the fourth electrode 540 to the third electrode 530. That is, when power is applied between the first and fourth electrodes 510, 540, heat may be absorbed at the first and fourth junctions 512, 542 and released at the second and third junctions 522, 532. If the first and second TE layers 550, 560 are respectively P-type and N-type semiconductors, then the potential applied to the first electrode 510 should be higher. If the first and second TE layers 550, 560 are respectively N-type and P-type semiconductors, then the potential applied to the fourth electrode 540 should be higher.

In one aspect, a combined area of the first and fourth junctions 512, 542 may overlap a heat source 505 at least partially. The overlap may be complete to maximize heat absorption from the heat source 505. In another aspect, a combined area of the second and third junctions 522, 532 may be larger than the combined area of the first and fourth junctions 512, 542 to enhance heat release.

While not shown, the second and third junctions 522, 532 may be on opposite lateral surfaces than the first and fourth junctions 512, 542. Nonetheless, in an aspect, the second and third junctions 522, 532 are parts of corresponding lateral surfaces. To state it another way, if the second electrode 520 is on the first lateral surface 552, then the third electrode 530 may be on the third lateral surface 562. Conversely, if the second electrode 520 is on the second lateral surface 554, then the third electrode 530 may be on the fourth lateral surface 564.

Also while not shown, an alternative is to electrically couple the first and fourth electrodes 510, 540 instead of the second and third electrodes 520, 530. In this alternative, a series electrical path may be formed in order from the third electrode 530, the second TE layer 560, the fourth electrode 540, the first electrode 510, the first TE layer 550, and the second electrode 520 assuming that the first and second TE layers 550, 560 remain as P-type and N-type semiconductors respectively. In this alternative, if a voltage is applied such that the voltage at the third electrode 530 is higher than the voltage at the second electrode 520, then a voltage drop would occur from the third electrode 530 to the fourth electrode 540, and another voltage drop would occur from the first electrode 510 to the second electrode 520. In other words, the voltage drop between the first and second electrodes 510, 520 and between the third and fourth electrodes 530, 540 would be in the same direction as the example device illustrated in FIG. 5A, and thus the heat transfer directions would also be the same.

Figure 6:
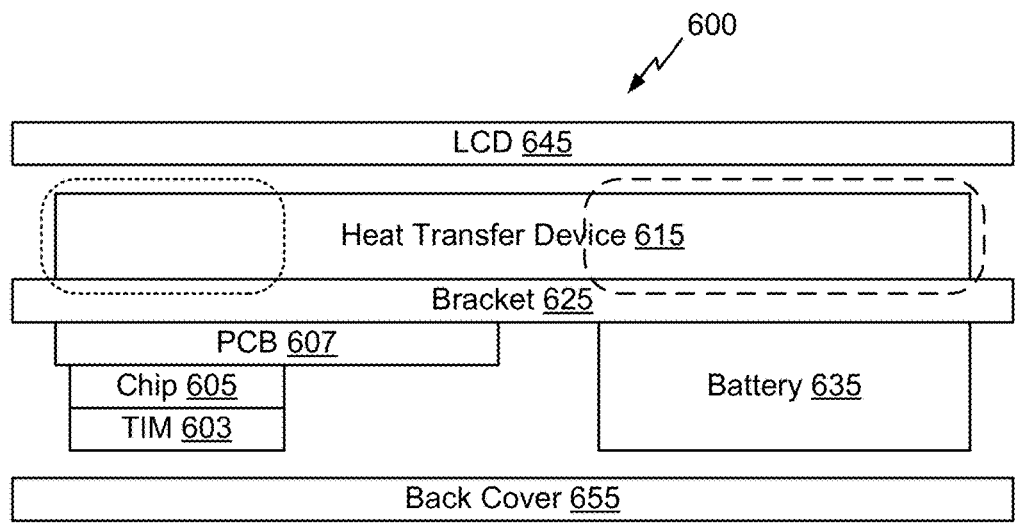
FIG. 6 illustrates an apparatus that incorporates a heat transfer device according to a non-limiting aspect of the disclosure.

Any or all of the heat transfer devices 300, 400, 500 and variations thereof may be incorporated in apparatuses such as mobile devices. An example of such an apparatus is illustrated in FIG. 6. An apparatus 600 may include a chip 605 and a battery 635. The chip 605 is an example of a heat source and the battery 635 is an example of a power source configured to provide power to one or more components of the apparatus 600 including the chip 605. The apparatus 600 may also include a display 645 (e.g., a liquid crystal display (LCD)) and a back cover 655 to house the internal components of the apparatus 600. In addition to the chip 605 and the battery 635, other internal components of the apparatus 600 may include a printed circuit board (PCB) 607, a thermal interface material (TIM) 603 and a bracket 625 (e.g., Mg-alloy bracket).

The apparatus 600 may incorporate a heat transfer device 615, which may be any of the heat devices 300, 400, 500 or variations thereof. In FIG. 6, a short-dashed rounded rectangle indicates a part of the heat transfer device 615 where heat from the chip 605 may be absorbed and a long-dashed rounded rectangle indicates where the heat may be released. The short-dashed rounded rectangle may correspond to heat absorption junctions (e.g., junctions 312, 412, 512, 542) and the long-dashed rounded rectangle may correspond to heat release junctions (e.g., junctions 322, 422, 522, 532). Through proper configuration of the heat transfer device 615, hot spots in the apparatus 600 may be mitigated.

Figure 7A:
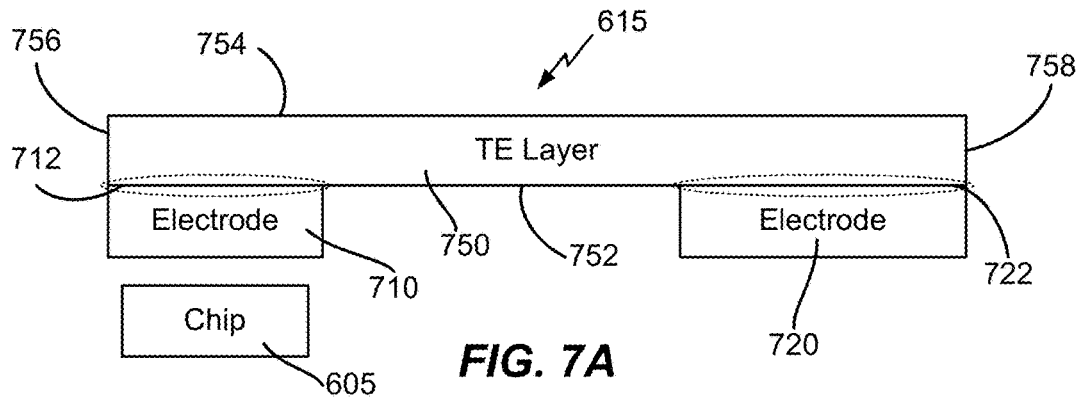
FIGS. 7A and 7B illustrate exemplary details of a heat transfer device that is incorporated into an apparatus according to a non-limiting aspect of the disclosure.

For efficiency, the electrodes that conduct heat from the chip 605 may be located close as practicable to the chip 605. This is shown in FIG. 7A which illustrates a detailed example of the heat transfer device 615. For simplicity, some of the internal components of the apparatus 600 such as the PCB 607 and the bracket 625 are not shown. As illustrated, a first electrode 710 may be in between the chip 605 and a TE layer 750. In other words, a first junction 712 may be a part of a first lateral surface 752 of the TE layer 750 that is oriented towards the chip 605. The first electrode 710 may be yet another example of means for applying the first voltage. The first junction 712 may overlap the chip 605. Also, a second junction 722, which is between the second electrode 720 and the TE layer 750, may have a larger area than the first junction 712. The second electrode 720 may be yet another example of means for applying the second voltage. The TE layer 750 may also have a second lateral surface 754, a first side surface 756, and a second side surface 758. The illustrated heat transfer device 615 may be similar to a vertically flipped variant of the heat transfer device 300 of FIG. 3B.

Figure 7B:
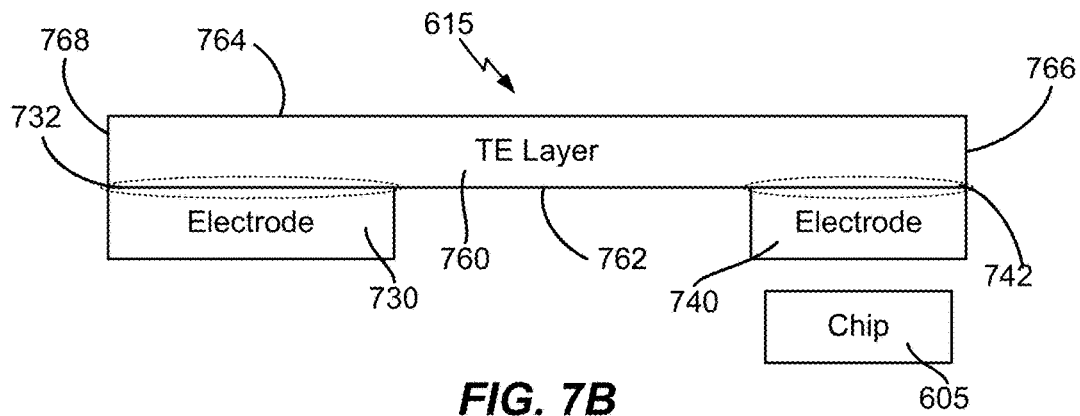

In another aspect, FIGS. 7A and 7B may be viewed as illustrating another detailed example of the heat transfer device 615. For example, this particular heat transfer device 615 may comprise first and second TE layers 750, 760 that are of opposite semiconductor types, and also comprise first, second, third and fourth electrodes 710, 720, 730 and 740. The second TE layer 760 may have third and fourth lateral surfaces 762, 764 and third and fourth side surfaces 766, 768. From a perspective, this particular heat transfer device 615 may be viewed as being similar to a vertically flipped variant of the heat transfer device 500 of FIGS. 5B and 5C. Referring back to FIGS. 7A and 7B, the first electrode 710 may be in between the chip 605 and the first TE layer 750, and the fourth electrode 740 may also be in between the chip 605 and the second TE layer 760. To state it another way, the first and fourth junctions 712, 742 may be parts of the first and third lateral surfaces 752, 762 of the first and second TE layers 750, 760 that are oriented towards the chip 605. A combination of the first and fourth junctions 712, 742 may overlap the chip 605. Also, the second and third junctions 722, 732 together may have a larger area than the first and fourth junctions 712, 742 together.

In FIG. 6, the heat transfer device 615 may be configured to transfer heat generated by the chip 605 so as to dissipate the heat to a cool area of the bracket 625. FIGS. 8, 9, 10 and 11 illustrate other examples of apparatuses 800, 900, 1000 and 1100 which may comprise components similar to that of the apparatus 600 including chips (805, 905, 1005, 1105), TIMs (803, 903, 1003, 1103), PCBs (807, 907, 1007, 1107), brackets (825, 925, 1025, 1125), batteries (835, 935, 1035, 1135), displays (845, 945, 1045, 1145), and back covers (855, 955, 1055, 1155).

Figure 8:
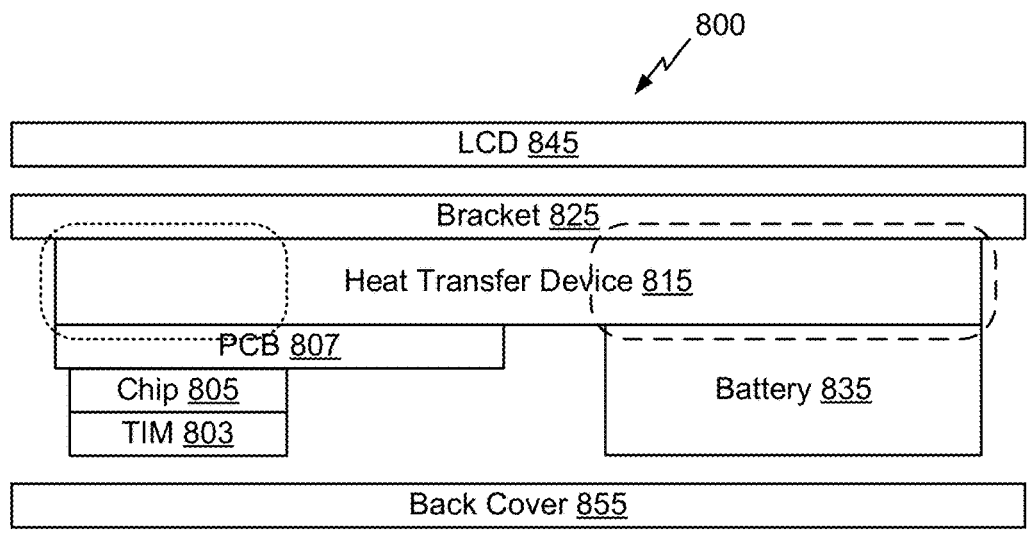
FIGS. 8, 9, 10 and 11 illustrate examples of apparatuses that incorporate heat transfer devices according to non-limiting aspects of the disclosure.
Figure 9:
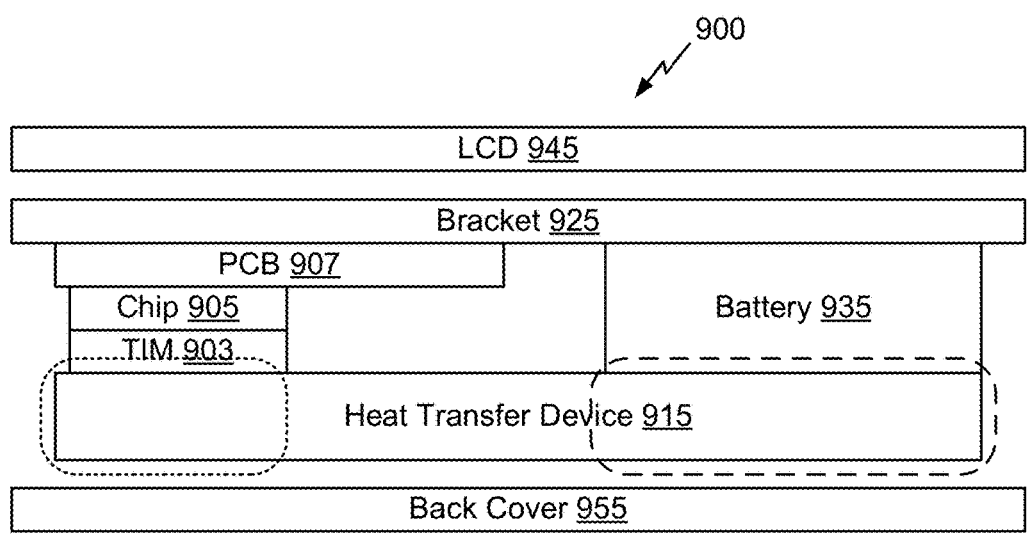
Figure 10:
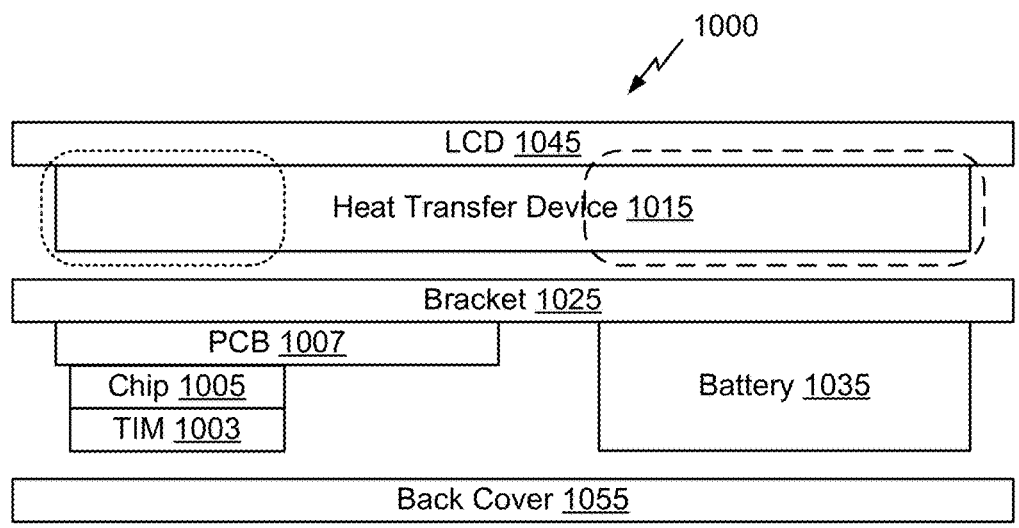
Figure 11:
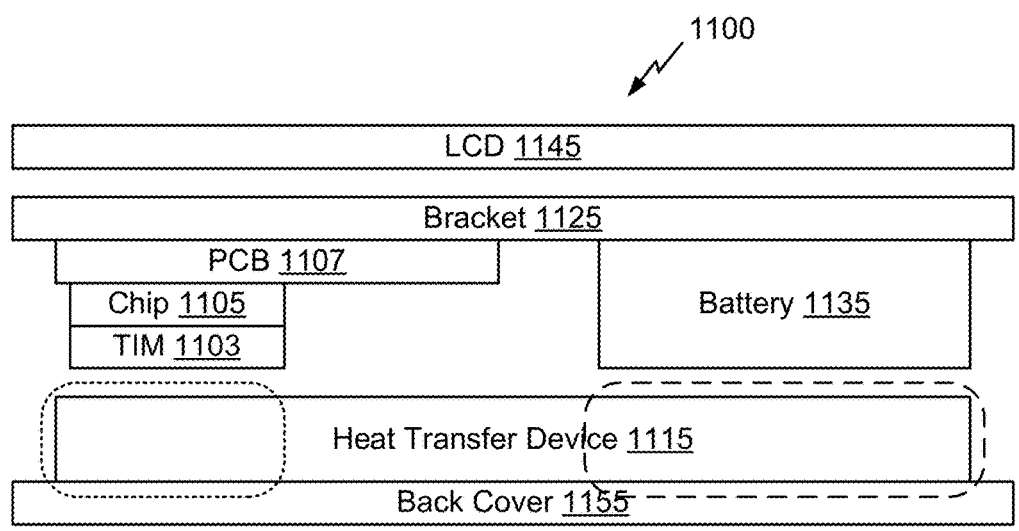

The apparatuses 800, 900, 1000, 1100 may incorporate heat transfer devices 815, 915, 1015, 1115. In FIG. 8, the heat transfer device 815 may be configured to transfer heat generated by the chip 805 so as to dissipate heat to a cool area of the bracket 825. Note that the heat transfer device 815 is in between the chip 805 and the bracket 825, whereas in FIG. 6, the bracket 625 is in between the chip 605 and the heat transfer device 615. In FIG. 9, the heat transfer device 915 may be configured so as to dissipate heat to the battery 935. In FIG. 10, the heat transfer device 1015 may be configured to dissipate heat to a cool area of the display 1045. In FIG. 11, the heat transfer device 1115 may be configured to dissipate heat to a cool area of the back cover 1155.

The heat transfer devices 815, 915, 1015, 1115 illustrated in FIGS. 6, 8, 9, 10 and 11 may be any of the heat transfer devices 300, 400, 500, 615 illustrated in FIGS. 3A, 3B, 4A, 4B, 5A, 5B, 5C, 6, 7A and 7B and variants thereof. In addition, while mobile devices have been specifically mentioned, the scope of the disclosure is not so limited. Various aspects may be applicable to many systems where active heat transfer capability is desirable.

Figure 12A:
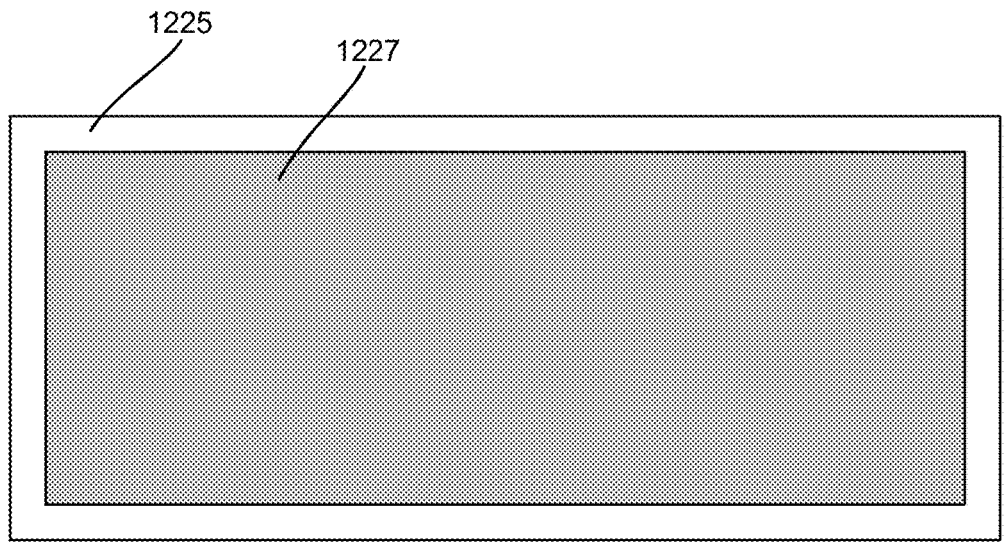
FIGS. 12A-12C illustrate stages of a method to form a heat transfer device according to a non-limiting aspect of the disclosure.
Figure 12B:
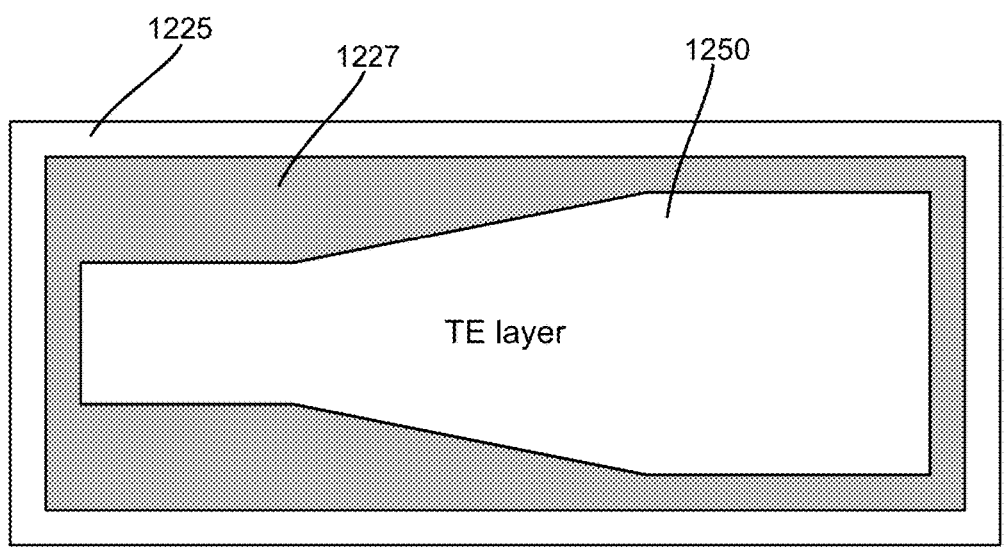
Figure 12C:
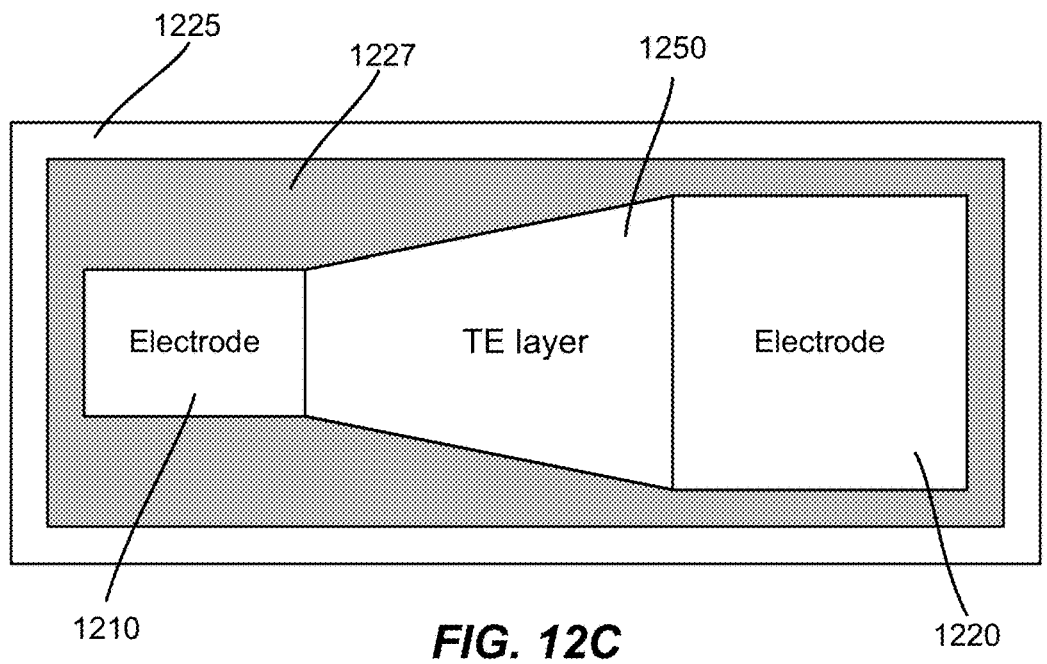

FIGS. 12A-12C illustrate views of various stages of an example method of forming a heat transfer device such as the heat transfer device 300. FIG. 12A illustrates a stage in which a passivation layer 1227 may be formed on a bracket 1225 such as an Mg-alloy bracket. For example, SiNx or SiOx may be deposited and patterned to form the passivation layer 1227 on the bracket 1225. The passivation layer 1227 can provide electrical insulation.

FIG. 12B illustrates a stage in which a TE layer 1250—either a P-type or an N-type semiconductor—may be formed on the passivation layer 1227. For example, a thin film semiconductor may be applied and patterned to form the TE layer 1250.

FIG. 12C illustrates a stage in which first and second electrodes 1210, 1220 may be formed on the TE layer 1250. For example, metal or metals may be deposited and patterned to form the first and second electrodes 1210, 1220.

Note that the stage illustrated in FIG. 12A may not be strictly necessary. It is recognized that to form the TE layer 1250, it is desirable to have a support structure such as the passivation layer 1227 on which to deposit the semiconductor material. Then depending on considerations such as desired thermal mitigation applications, costs, ease of manufacturing among others, different types of support structures may be utilized.

Figure 13:
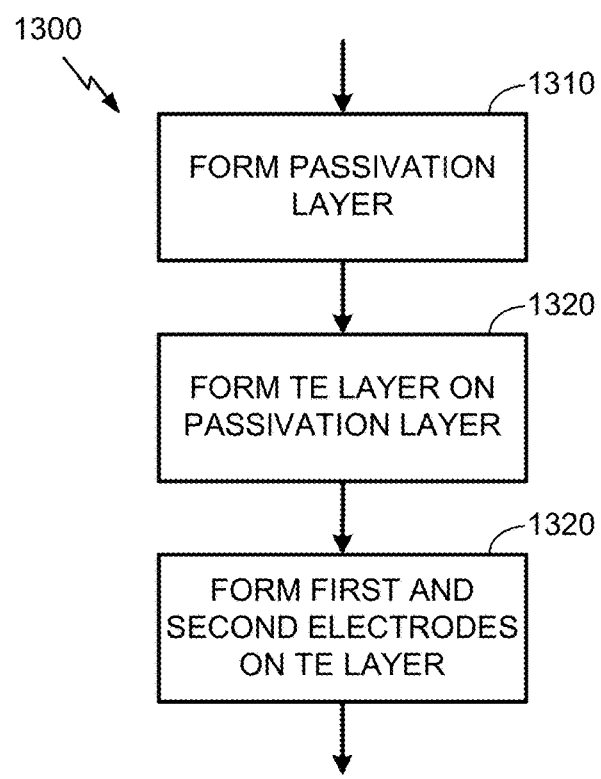
FIG. 13 illustrates a flow chart of a method to form a heat transfer device according to a non-limiting aspect of the disclosure.

FIG. 13 illustrates a flow chart of an example method 1300 to form a heat transfer device such as the heat transfer device 300. In block 1310 of the method 1300, the passivation layer 1227 may be formed (e.g., see FIG. 12A). In block 1320, the TE layer 1250 may be formed (e.g., see FIG. 12B). In block 1330, the first and second electrodes 1210, 1220 may be formed on the TE layer 1250 (e.g., see FIG. 12C). The resulting heat transfer device of the method 1300 may include some or all of the characteristics of the heat transfer device 300 described in detail above, and thus will not be repeated. It should be kept in mind that it is relatively straight forward to vary the method 1300 so as to arrive at some or all aspects of the heat transfer devices described in detail above, as well as their unillustrated variants.

Figure 14A:
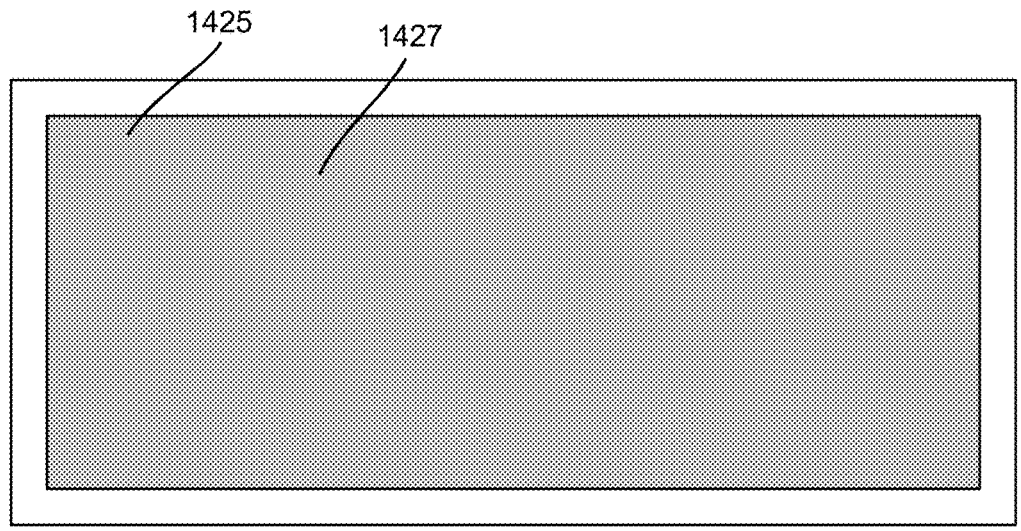
FIGS. 14A-14C illustrate stages of another method to form a heat transfer device according to a non-limiting aspect of the disclosure.
Figure 14B:
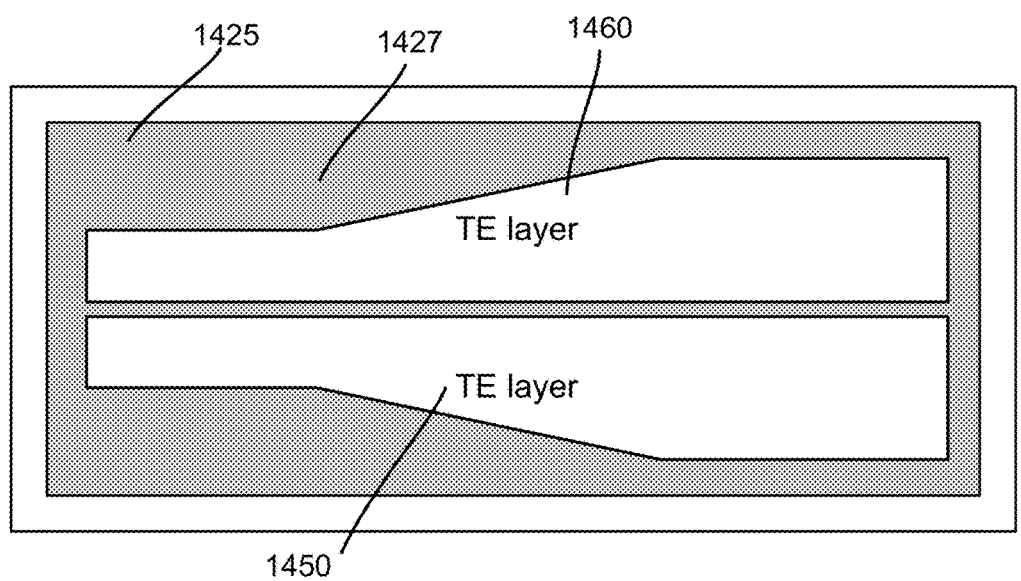
Figure 14C:
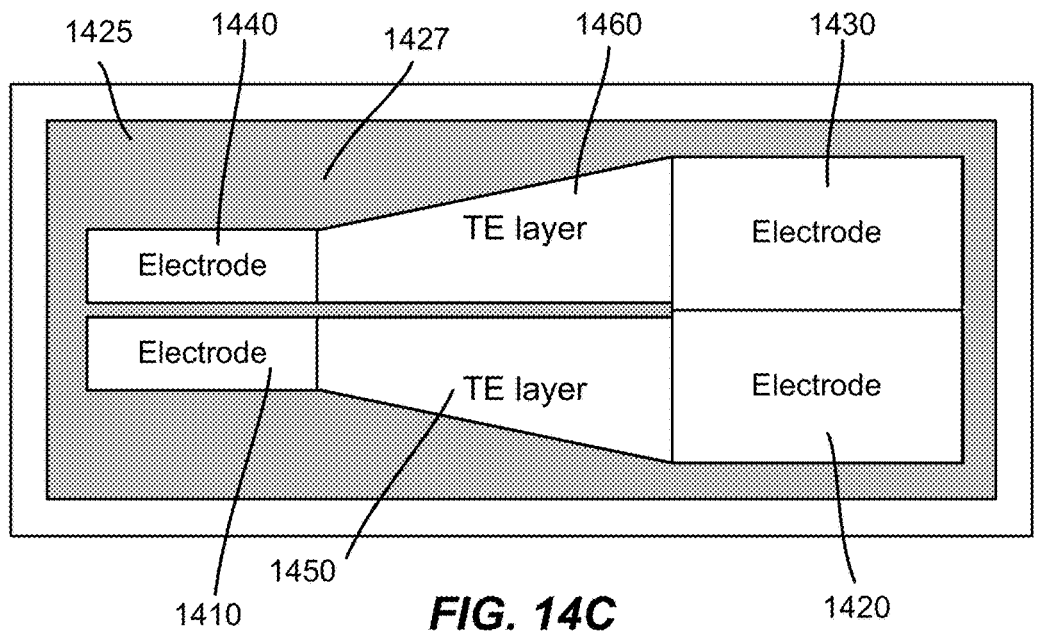

FIGS. 14A-14C illustrate stages of another method to form a heat transfer device such as the heat transfer device 500. FIG. 14A illustrates a stage in which a passivation layer 1427 may be formed on a bracket 1425 such as an Mg-alloy bracket. This is similar to the stage illustrated in FIG. 12A, so details will not be repeated. Also, like FIG. 12A, the stage of FIG. 14A is not necessary.

FIG. 14B illustrates a stage in which first and second TE layers 1450, 1460—one of each semiconductor type—may be formed on the passivation layer 1427. For example, a thin film semiconductor of one type (e.g., P-type) may be applied and patterned to form the first TE layer 1450, and a thin film semiconductor of the opposite type (e.g., N-type) may be applied and patterned to form the second TE layer 1460.

FIG. 14C illustrates a stage in which first and second electrodes 1410, 1420 may be formed on the first TE layer 1450, and in which third and fourth electrodes 1430, 1440 may be formed on the second TE layer 1460. For example, metal or metals may be deposited and patterned to form the first, second, third and fourth electrodes 1410, 1420, 1430 and 1440. The second and third electrodes 1420, 1430 may be formed to be electrically coupled to each other. Note that in an aspect, a single electrode may be formed to serve as the second and third electrodes 1420, 1430. While not illustrated, the first and fourth electrodes 1410, 1440 may be formed to be electrically coupled to each other in an alternative. In an alternative aspect, a single electrode may be formed to serve as the first and fourth electrodes 1410, 1440.

Figure 15:
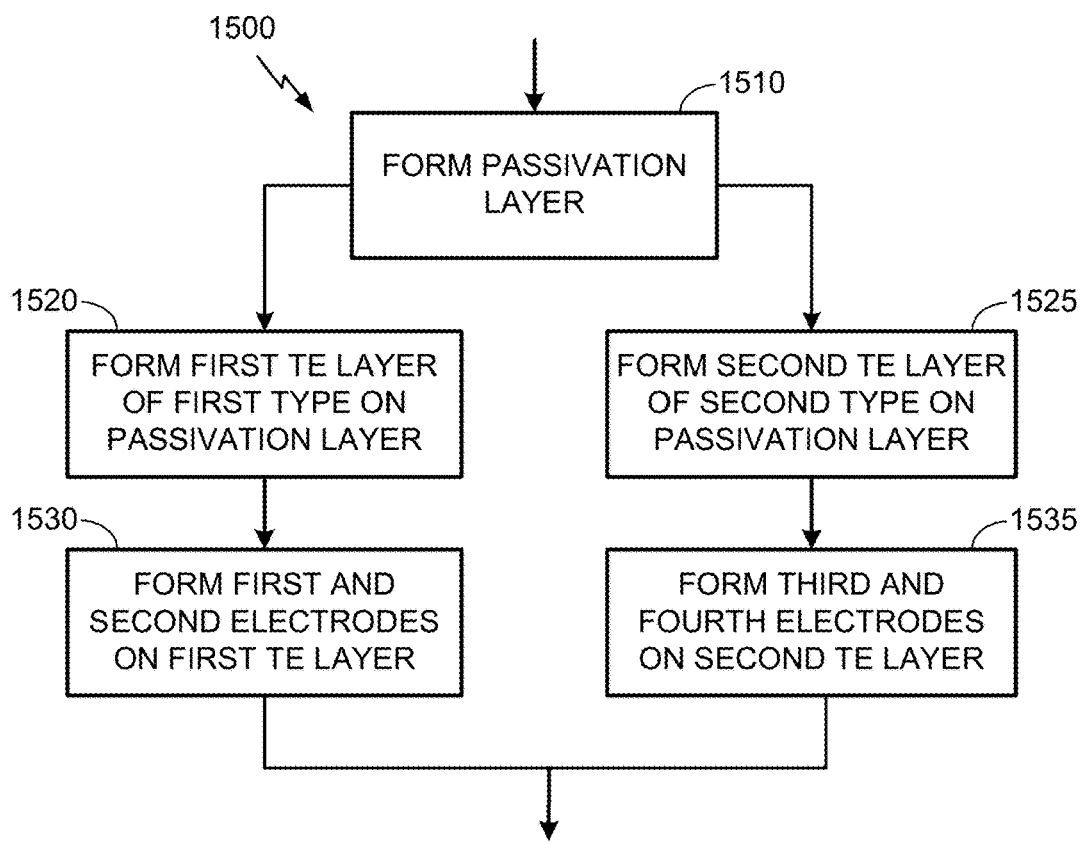
FIG. 15 illustrates a flow chart of another method to form a heat transfer device according to a non-limiting aspect of the disclosure.

FIG. 15 illustrates a flow chart of another example method 1500 to form a heat transfer device such as the heat transfer device 500. In block 1510 of the method 1500, the passivation layer 1427 may be formed (e.g., see FIG. 14A). In block 1520, the first TE layer 1450 may be formed, and in block 1525, the second TE layer 1460 may be formed (e.g., see FIG. 14B). In block 1530, the first and second electrodes 1410, 1420 may be formed on the first TE layer 1450, and in block 1535, the third and fourth electrodes 1430, 1440 may be formed on the second TE layer 1460 (e.g., see FIG. 14C).

The resulting heat transfer device of the method 1500 may include some or all of the characteristics of the heat transfer device 500 described in detail above, and thus will not be repeated. And again, it should be kept in mind that it is relatively straight forward to vary the method 1500 so as to arrive at some or all examples of the heat transfer devices described in detail above, as well as their unillustrated variants.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosed subject matter.

The methods, sequences and/or algorithms described in connection with the examples disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an aspect can include a computer-readable media embodying a method for forming an active heat transfer device. Accordingly, the scope of the disclosed subject matter is not limited to illustrated examples and any means for performing the functionality described herein are included.

While the foregoing disclosure shows illustrative examples, it should be noted that various changes and modifications could be made herein without departing from the scope of the disclosed subject matter as defined by the appended claims. The functions, steps and/or actions of the method claims in accordance with the examples described herein need not be performed in any particular order. Furthermore, although elements of the examples may be described or claimed in the singular, the plural is also contemplated unless limitation to the singular is explicitly stated.

What is claimed is:

1. A heat transfer device, comprising:
    a thermoelectric (TE) layer with a first lateral surface, a second lateral surface, a first side surface, and a second side surface, wherein each of the first and second lateral surfaces is longer than each of the first and second side surfaces;
    a first electrode on the first lateral surface of the TE layer, the first electrode configured to interface with the TE layer at a first junction; and
    a second electrode on the first lateral surface or on the second lateral surface of the TE layer, the second electrode configured to interface with the TE layer at a second junction,
    wherein the heat transfer device is configured to transfer heat generated by a heat source laterally within the TE layer from the first electrode to the second electrode when a voltage differential is applied between the first electrode and the second electrode, and
    wherein the first electrode is configured to thermally conduct the heat from the heat source to the TE layer at the first junction.

2. The heat transfer device of claim 1, wherein the first junction overlaps the heat source such that the first electrode is vertically in between the heat source and the TE layer.

3. The heat transfer device of claim 1,
    wherein the first junction is an area of contact between the first electrode and the TE layer and the second junction is an area of contact between the second electrode and the TE layer, and
    wherein the second junction has a larger area than the first junction.

4. The heat transfer device of claim 1,
    wherein the first junction begins at or substantially at the first side surface and extends towards the second side surface, and
    wherein the second junction begins at or substantially at the second side surface and extends towards the first side surface.

5. The heat transfer device of claim 1, wherein the TE layer is a first TE layer, the heat transfer device further comprising:
    a second TE layer with a third lateral surface, a fourth lateral surface, a third side surface, and a fourth side surface, wherein each of the third and fourth lateral surfaces is longer than each of the third and fourth side surfaces;
    a third electrode on the third lateral surface or on the fourth lateral surface of the second TE layer, the third electrode configured to interface with the second TE layer at a third junction,
    a fourth electrode on the third lateral surface of the second TE layer, the fourth electrode configured to interface with the second TE layer at a fourth junction,
    wherein a plane of the first lateral surface is substantially parallel to a plane of the third lateral surface, a plane of the second lateral surface is substantially parallel to a plane of the fourth lateral surface, a plane of the first side surface is substantially parallel to a plane of the third side surface, and a plane of the second side surface is substantially parallel to a plane of the fourth side surface,
    wherein the second and third electrodes are electrically coupled such that a series electrical path is formed in order from the first electrode, the first TE layer, the second electrode, the third electrode, the second TE layer, and the fourth electrode,
    wherein the heat transfer device is configured to transfer the heat generated by the heat source laterally within the first TE layer from the first electrode to the second electrode and laterally within the second TE layer from the fourth electrode to the third electrode when a voltage differential is applied between the first electrode and the fourth electrode, and
    wherein the first electrode is configured to thermally conduct the heat from the heat source to the first TE layer at the first junction and the fourth electrode is configured to thermally conduct the heat from the heat source to the second TE layer at the fourth junction.

6. The heat transfer device of claim 5, wherein the first and second TE layers are located side by side such that a thermal path from the first electrode to the second electrode within the first TE layer is substantially parallel to a thermal path from the fourth electrode to the third electrode within the second TE layer.

7. The heat transfer device of claim 5, wherein the first and third lateral surfaces are substantially coplanar and/or the second and fourth lateral surfaces are substantially coplanar and/or the first and third side surfaces are substantially coplanar and/or the second and fourth side surfaces are substantially coplanar.

8. The heat transfer device of claim 5, wherein a combination of the first and fourth junctions overlaps the heat source such that the first electrode is vertically in between the heat source and the first TE layer and such that the second electrode is vertically in between the heat source and the second TE layer.

9. The heat transfer device of claim 5,
wherein the first junction is an area of contact between the first electrode and the first TE layer, the second junction is an area of contact between the second electrode and the first TE layer, the third junction is an area of contact between the third electrode and the second TE layer, and the fourth junction is an area of contact between the fourth electrode and the second TE layer, and
wherein a combination of the second and third junctions has a larger area than a combination of the first and fourth junctions.

10. The heat transfer device of claim 5, wherein the second and third electrodes are respectively on the first and third lateral surfaces or are respectively on the second and fourth lateral surfaces.

11. The heat transfer device of claim 5,
wherein the first junction begins at or substantially at the first side surface and extends towards the second side surface,
wherein the second junction begins at or substantially at the second side surface and extends towards the first side surface,
wherein the third junction begins at or substantially at the fourth side surface and extends towards the third side surface, and
wherein the fourth junction begins at or substantially at the third side surface and extends towards the fourth side surface.

12. The heat transfer device of claim 5, wherein a single electrode serves as the second electrode and as the third electrode.

13. An apparatus, comprising:
a chip;
a battery configured to provide power to the chip; and
a heat transfer device configured to actively transfer heat away from the chip, the heat transfer device comprising:
a thermoelectric (TE) layer with a first lateral surface, a second lateral surface, a first side surface, and a second side surface, wherein each of the first and second lateral surfaces is longer than each of the first and second side surfaces;
a first electrode on the first lateral surface of the TE layer, the first electrode configured to interface with the TE layer at a first junction; and
a second electrode on the first lateral surface or on the second lateral surface of the TE layer, the second electrode configured to interface with the TE layer at a second junction,
wherein the first junction overlaps the chip,
wherein the heat transfer device is configured to transfer the heat generated by the chip laterally within the TE layer from the first electrode to the second electrode when the battery applies a voltage differential between the first electrode and the second electrode, and
wherein the first electrode is configured to thermally conduct the heat from the chip to the TE layer at the first junction.

14. The apparatus of claim 13,
wherein the first junction is an area of contact between the first electrode and the TE layer, and the second junction is an area of contact between the second electrode and the TE layer, and
wherein the second junction has a larger area than the first junction.

15. The apparatus of claim 13,
wherein the first junction begins at or substantially at the first side surface and extends towards the second side surface, and
wherein the second junction begins at or substantially at the second side surface and extends towards the first side surface.

16. The apparatus of claim 13, wherein the first electrode is vertically in between the chip and the TE layer.

17. The apparatus of claim 13,
wherein the TE layer is a first TE layer and the heat transfer device further comprises:
a second TE layer with a third lateral surface, a fourth lateral surface, a third side surface, and a fourth side surface, wherein each of the third and fourth lateral surfaces is longer than each of the third and fourth side surfaces;
a third electrode on the third lateral surface or on the fourth lateral surface of the second TE layer, the third electrode configured to interface with the second TE layer at a third junction; and
a fourth electrode on the third lateral surface of the second TE layer, the fourth electrode configured to interface with the second TE layer at a fourth junction,
wherein the first and second TE layers are located side by side such that a thermal path from the first electrode to the second electrode within the first TE layer is substantially parallel to a thermal path from the fourth electrode to the third electrode within the second TE layer,
wherein the second and third electrodes are electrically coupled such that a series electrical path is formed in order from the first electrode, the first TE layer, the second electrode, the third electrode, the second TE layer, and the fourth electrode,
wherein a combination of the first and fourth junctions overlaps the chip,
wherein the heat transfer device is configured to transfer the heat generated by the chip laterally within the first TE layer from the first electrode to the second electrode and laterally within the second TE layer from the fourth electrode to the third electrode when the battery applies a voltage differential between the first electrode and the fourth electrode, and
wherein the first electrode is configured to thermally conduct the heat from the chip to the first TE layer at the first junction and the fourth electrode is configured to thermally conduct the heat from the heat source to the second TE layer at the fourth junction.

18. The apparatus of claim 17,
wherein the first junction is an area of contact between the first electrode and the first TE layer, the second junction is an area of contact between the second electrode and the first TE layer, the third junction is an area of contact between the third electrode and the second TE layer, and the fourth junction is an area of contact between the fourth electrode and the second TE layer, and
wherein a combination of the second and third junctions has a larger area than the combination of the first and fourth junctions.

19. The apparatus of claim 17,
wherein the first junction begins at or substantially at the first side surface and extends towards the second side surface,
wherein the second junction begins at or substantially at the second side surface and extends towards the first side surface,
wherein the third junction begins at or substantially at the fourth side surface and extends towards the third side surface, and
wherein the fourth junction begins at or substantially at the third side surface and extends towards the fourth side surface.

20. The apparatus of claim 17, wherein the first electrode is vertically in between the chip and the first TE layer, and the fourth electrode is vertically in between the chip and the second TE layer.

21. The apparatus of claim 13, further comprising:
a display;
a back cover; and
a bracket in between the display and the back cover,
wherein the heat transfer device is configured to transfer heat generated by the chip so as to dissipate the heat to any one or more of a cool area of the bracket, the battery, a cool area of the display, and a cool area of the back cover.

22. A method of forming a heat transfer device, comprising:
forming a thermoelectric (TE) layer with a first lateral surface, a second lateral surface, a first side surface, and a second side surface such that each of the first and second lateral surfaces is longer than each of the first and second side surfaces;
forming a first electrode on the first lateral surface of the TE layer such that the first electrode interfaces with the TE layer at a first junction; and
forming a second electrode on the first lateral surface or on the second lateral surface of the TE layer such that the second electrode interfaces with the TE layer at a second junction,
wherein the heat transfer device is formed such that heat generated by a heat source is transferred laterally within the TE layer from the first electrode to the second electrode when a voltage differential is applied between the first electrode and the second electrode, and
wherein the heat transfer device is formed such that the first electrode thermally conducts the heat from the heat source to the TE layer at the first junction.

23. The method of forming the heat transfer device of claim 22,
wherein the first electrode is formed vertically in between the heat source and the TE layer,
wherein the first junction is an area of contact between the first electrode and the TE layer, and the second junction is an area of contact between the second electrode and the TE layer, and
wherein the second electrode is formed such that the second junction has a larger area than the first junction.

24. The method of forming the heat transfer device of claim 22,
wherein the first electrode is formed such that the first junction begins at or substantially at the first side surface and extends towards the second side surface, and
wherein the second electrode is formed such that the second junction begins at or substantially at the second side surface and extends towards the first side surface.

25. The method of forming the heat transfer device of claim 22, wherein forming the TE layer comprises forming a first TE layer, the method further comprising:
forming a second TE layer with a third lateral surface, a fourth lateral surface, a third side surface, and a fourth side surface such that each of the third and fourth lateral surfaces is longer than each of the third and fourth side surfaces;
forming a third electrode on the third lateral surface or on the fourth lateral surface of the second TE layer such that the third electrode interfaces with the second TE layer at a third junction; and
forming a fourth electrode on the third lateral surface of the second TE layer such that the fourth electrode interfaces with the second TE layer at a fourth junction,
wherein the first and second TE layers are formed such that a plane of the first lateral surface is substantially parallel to a plane of the third lateral surface, a plane of the second lateral surface is substantially parallel to a plane of the fourth lateral surface, a plane of the first side surface is substantially parallel to a plane of the third side surface, and a plane of the second side surface is substantially parallel to a plane of the fourth side surface,
wherein the second and third electrodes are formed so as to be electrically coupled to each other such that a series electrical path is formed in order from the first electrode, the first TE layer, the second electrode, the third electrode, the second TE layer, and the fourth electrode,
wherein the heat transfer device is formed such that the heat generated by the heat source is transferred laterally within the first TE layer from the first electrode to the second electrode and laterally within the second TE layer from the fourth electrode to the third electrode when a voltage differential is applied between the first electrode and the fourth electrode, and
wherein the heat transfer device is formed such that the first electrode thermally conducts the heat from the heat source to the first TE layer at the first junction and the fourth electrode thermally conducts the heat from the heat source to the second TE layer at the fourth junction.

26. The method of forming the heat transfer device of claim 25,
wherein the first electrode and the fourth electrode are formed vertically in between the heat source and the first TE layer and the second TE layer, respectively,
wherein the first junction is an area of contact between the first electrode and the first TE layer, the second junction is an area of contact between the second electrode and the first TE layer, wherein the third junction is an area of contact between the third electrode and the second TE layer, and the fourth junction is an area of contact between the fourth electrode and the second TE layer, and wherein the second electrode and the third electrode are formed such that a combination of the second and third junctions has a larger area than the combination of the first and fourth junctions.

27. The method of forming the heat transfer device of claim 25, wherein the first and second TE layers are formed such that the first and third lateral surfaces are substantially coplanar, the second and fourth lateral surfaces are substantially coplanar, the first and third side surfaces are substantially coplanar, and the second and fourth side surfaces are substantially coplanar.

28. The method of forming the heat transfer device of claim 25, wherein the first electrode is formed such that the first junction begins at or substantially at the first side surface and extends towards the second side surface, wherein the second electrode is formed such that the second junction begins at or substantially at the second side surface and extends towards the first side surface, wherein the third electrode is formed such that the third junction begins at or substantially at the fourth side surface and extends towards the third side surface, and wherein the fourth electrode is formed such that the fourth junction begins at or substantially at the third side surface and extends towards the fourth side surface.

29. A heat transfer device, comprising:

a thermoelectric (TE) layer with a first lateral surface, a second lateral surface, a first side surface, and a second side surface, wherein each of the first and second lateral surfaces is longer than each of the first and second side surfaces;

means for applying a first voltage on the first lateral surface of the TE layer, the means for applying the first voltage interfacing with the TE layer at a first junction; and means for applying a second voltage on the first lateral surface or on the second lateral surface of the TE layer, the means for applying the second voltage interfacing with the TE layer at a second junction, wherein the heat transfer device is configured to transfer heat generated by a heat source laterally within the TE layer from the means for applying the first voltage to the means for applying the second voltage when a voltage differential is applied between the means for applying the first voltage and the means for applying the second voltage, and wherein the means for applying the first voltage thermally conducts the heat from the heat source to the TE layer at the first junction.

30. The heat transfer device of claim 29, wherein the TE layer is a first TE layer, the heat transfer device further comprising:

a second TE layer with a third lateral surface, a fourth lateral surface, a third side surface, and a fourth side surface, wherein each of the third and fourth lateral surfaces is longer than each of the third and fourth side surfaces;

means for applying a third voltage on the third lateral surface or on the fourth lateral surface of the second TE layer, the means for applying the third voltage interfacing with the second TE layer at a third junction; and means for applying a fourth voltage on the third lateral surface of the second TE layer, the means for applying the fourth voltage interfacing with the second TE layer at a fourth junction, wherein a plane of the first lateral surface is substantially parallel to a plane of the third lateral surface, a plane of the second lateral surface is substantially parallel to a plane of the fourth lateral surface, a plane of the first side surface is substantially parallel to a plane of the third side surface, and a plane of the second side surface is substantially parallel to a plane of the fourth side surface, wherein the means for applying the third voltage and the means for applying the second voltage are electrically coupled such that a series electrical path is formed in order from the means for applying the first voltage, the first TE layer, the means for applying the second voltage, the means for applying the third voltage, the second TE layer, and the means for applying the fourth voltage, wherein the heat transfer device is configured to transfer the heat generated by the heat source laterally within first TE layer from the means for applying the first voltage to the means for applying the second voltage and laterally within the second TE layer from the means for applying the fourth voltage to the means for applying the third voltage when a voltage differential is applied between the means for applying the first voltage and the means for applying the fourth voltage, and wherein the means for applying the first voltage thermally conducts the heat from the heat source to the first TE layer at the first junction and the means for applying the fourth voltage thermally conducts the heat from the heat source to the second TE layer at the fourth junction.

* * * * *